United States Patent [19]

Uramoto et al.

[11] Patent Number: 5,068,818
[45] Date of Patent: Nov. 26, 1991

[54] HARDWARE IMPLEMENTED MOVING AVERAGE PROCESSOR

[75] Inventors: Shinichi Uramoto; Hideyuki Terane, both of Hyogo, Japan

[73] Assignee: Mitbushi Denki Kabushiki Kaisha, Tokyo, Japan

[21] Appl. No.: 461,966

[22] Filed: Jan. 8, 1990

[30] Foreign Application Priority Data

Jun. 6, 1989 [JP] Japan .................. 1-144784

[51] Int. Cl.$^5$ .............................. G06F 7/38
[52] U.S. Cl. ................. 364/734; 364/715.08; 364/575
[58] Field of Search ............. 364/575, 734, 715.08

[56] References Cited

U.S. PATENT DOCUMENTS

| | | | |
|---|---|---|---|
| 4,193,118 | 3/1980 | Nash et al. | 364/734 |
| 4,368,433 | 1/1983 | Imazeki et al. | 364/734 |
| 4,383,304 | 5/1983 | Hirashima | 364/715.08 |
| 4,475,173 | 10/1984 | Talmi | 364/715.08 |
| 4,490,800 | 12/1984 | Powers | 364/575 |
| 4,789,953 | 12/1988 | Gerrath | 364/734 |
| 4,901,263 | 2/1990 | Ho et al. | 364/715.08 |

FOREIGN PATENT DOCUMENTS

| | | | |
|---|---|---|---|
| 0112177 | 6/1985 | Japan | 364/734 |
| 63-19071 | 1/1988 | Japan . | |
| 63-187366 | 8/1988 | Japan . | |

Primary Examiner—Dale M. Shaw
Attorney, Agent, or Firm—Lowe, Price, LeBlanc and Becker

[57] ABSTRACT

A device for finding a moving average of a signal applied from a signal source includes a first delay circuit for delaying input data sampled in a predetermined sampling period by a time period corresponding to N sampling periods where N is an integer, an accumulator for receiving an output of the first delay circuit and input data to store data of $(N-1)$ terms, and a divider for dividing an output of the accumulator by a coefficient $(N-1)$. The accumulator includes an adder, a second delay circuit for delaying an output of the adder by a time period corresponding to one sampling period, and a subtractor for carrying out subtraction between the output of the first delay circuit and that of the second delay circuit to supply a result of the subtraction to the divider. The adder adds input data and an output of the subtractor. This configuration enables implementation of the device for performing fast moving average processing with a simple configuration.

11 Claims, 8 Drawing Sheets

HARDWARE IMPLEMENTED MOVING AVERAGE PROCESSOR

BACKGROUND OF THE INVENTION

1. Field of the Invention

The present invention relates generally to moving average processors and, more particularly, to a configuration of a processor capable of obtaining a moving average at high speed with a simple circuit configuration.

2. Description of the Background Art

Various kinds of sensors are generally used for monitoring the state of an object to be measured. It is necessary to remove noise components included in outputs of the sensors in order to precisely determine the state of the object to be measured. In order to remove noises included in a signal sequence such as the sensor outputs or like and to provide an accurate input signals sequence, the input signal sequence is often subject to moving average processing.

The moving average is a method of taking the average value of several terms adjacent to data Ai in the case that a series of data (a series of sampled values sampled in a predetermined sampling period) {Ai} is supplied. In the case that a series of input data is a series of sampled values which are made discrete in time, the moving average processing corresponds to low-pass filter processing. There are two main conventional methods of performing the moving average processing. The one is software processing and the other is hardware processing with a digital filter. These methods will now be described.

First of all, a description will be given on the method of obtaining the moving average by the software processing. In this method, the series of input data is first stored in a storage in a processing system such as a computer. In the case of the moving average processing of five terms, for example, the following arithmetic operation is sequentially preformed.

$$A_i = (A_{i-2} + A_{i-1} + A_i + A_{i+1} + A_{i+2})/5 \quad (1)$$

In this case, respective data stored in the storage of the processing system are sequentially read out, so that the arithmetic operation of the above expression (1) is performed for the respective read-out data. This operation is not performed actually by one-time arithmetic operation but by several times of adding operation and one-time of dividing operation.

Figure 1:
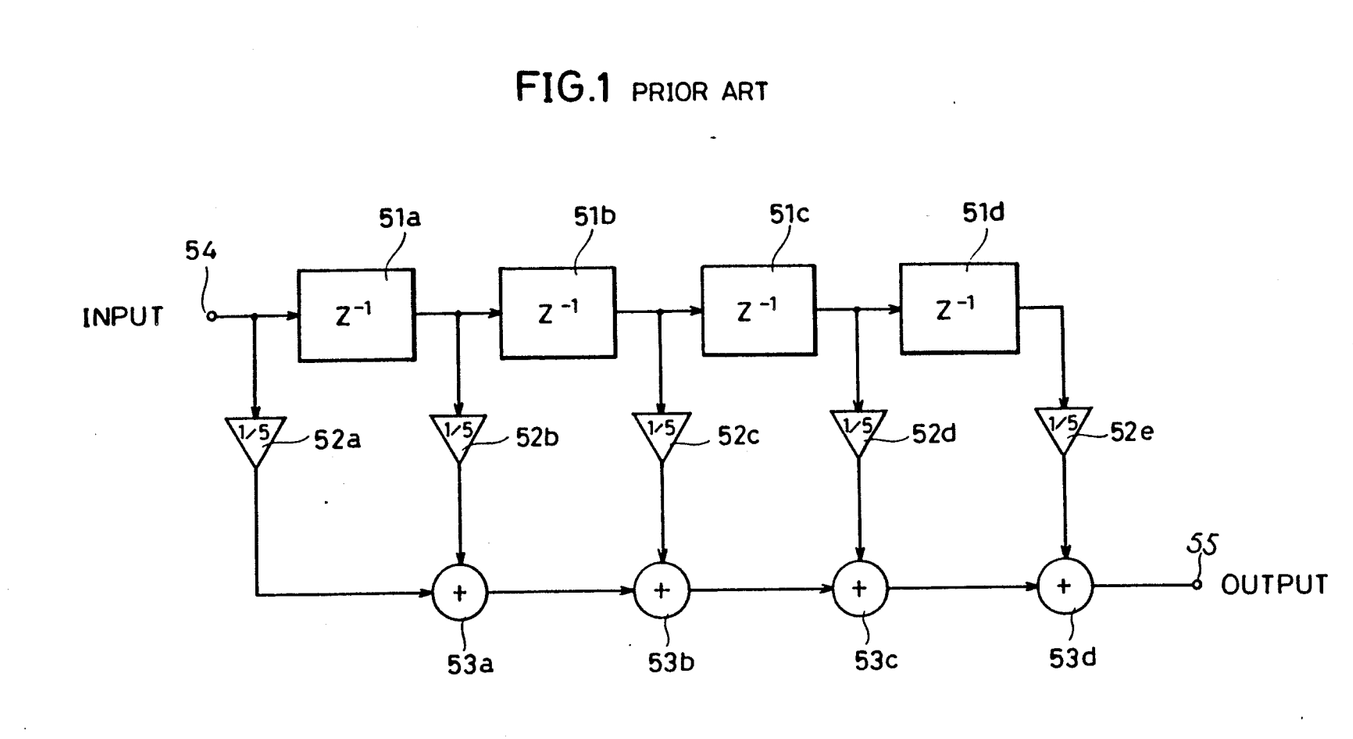
FIG. 1 is a diagram illustrating an example of the configuration of a conventional moving average processor.

In the hardware processing, the above expression (1) is processed by hardware. FIG. 1 shows an example of the configuration of a device for performing the moving average processing on five terms, employing a digital filter (an FIR filter: a finite impulse response filter).

Referring to FIG. 1, a conventional moving average processor comprises cascade-connected first through fourth delay elements 51a, 51b, 51c and 51d, multipliers 52a, 52b, 52c, 52d and 52e for multiplying input data and the respective outputs of the delay elements 51a to 51d by their respective predetermined coefficients, and cascade-connected first through fourth adders 53a, 53b, 53c and 53d for adding the respective outputs of the multipliers 52a to 52e to output the result of the addition.

The first through fourth delay elements 51a–51d delay supplied data by the time corresponding to one sampling period of the input data and then transmit the delayed data to the delay elements at their succeeding stages, respectively. The multiplier 52a multiplies the input data supplied from an input terminal 54 by a coefficient (1/5) to output the result of the multiplication. The multiplier 51b multiplies the output of the first delay element 51a by the coefficient (1/5) to output the result of the multiplication. The multiplier 52c multiplies the output of the second delay element 51b by the coefficient (1/5) to output the result of the multiplication. The multiplier 52d multiplies the output of the third delay element 51c by the coefficient (1/5) to output the result of the multiplication. The multiplier 52e multiplies the output of the fourth delay element 51d by the coefficient (1/5) to output the result of the multiplication.

The first adder 53a adds the output of the multiplier 52a and that of the multiplier 52b. The second adder 53b adds the output of the multiplier 52c and that of the adder 53a. The adder 53c adds the output of the multiplier 52d and that of the adder 53b. The fourth adder 53d adds the output of the fifth multiplier 52e and that of the third adder 53c. Output data is outputted via an output terminal 55 from the adder 53d. An operation will be described briefly.

A case is now considered that the sampling data $A_i$ is supplied to the input terminal 54. At this time, the delay elements 51a–51d output input data $A_{i-1}$ preceding by one sampling period to the present data, input data $A_{i-2}$ preceding by two sampling periods, input data $A_{i-3}$ preceding by three sampling periods, and input data $A_{i-4}$ preceding by four sampling periods, respectively. The multipliers 52a–52e multiply the respective supplied data by the respective coefficients (1/5) to output the results of the multiplication to the associated adders. Therefore, the fourth adder 53d outputs data expressed below:

$$(A_i + A_{i-1} + A_{i-2} + A_{i-3} + A_{i-4})/5 \quad (2)$$

and, the data of the above expression (2) is outputted as output data (a moving average value) from the output terminal 55.

Although the expression (2) seems different from the previous expression (1), a series of data to be outputted is a series of moving average values of the input data sequence supplied to the input terminal 54, which is expressed as $$\left\{ A_t = 1/5 \sum_{k=0}^{4} A_{t-k} \right\},$$

thus providing the same arithmetic operation.

In the case of performing the moving average processing by employing the described software processing, many times of adding operations are necessary for one-time data processing, and thus it is generally difficult to carry out the moving average processing at high speed. That is, in order to perform the operation of the above expression (1) or (2), the following step is usually carried out, for example: first of all, one data is added to the other, and the result of this addition is stored in a register. A value stored in this register is then added to the succeeding data. A dividing operation is carried out after this adding operation is carried out predetermined times (four times in the above described expression). The dividing operation in the software processing is usually the same as a subtracting operation, i.e., the adding operation. Thus, this dividing operation requires plural times of the adding operations in data processing by the software processing, and hence fast moving average processing cannot be carried out. Furthermore, in order to perform the operation of the above expression (1) or (2), a storage such as a register becomes necessary for storing input data and output data.

Meanwhile, in the method of carrying out the moving average processing by hardware employing a digital filter, this arithmetic operation can generally be carried out at higher speed than in software processing. However, for performance of the moving average processing of M terms, M multipliers and (M−1) adders are required, resulting in enlargement of the device. Further, once hardware implementation is fixed, processing conditions such as the number of terms of the moving average is uniquely determined, and thus it is difficult in general to alter these conditions.

Examples of the "digital filter" in software and hardware implementations are respectively shown in Journal "Interface", published by CQ Shuppan, November 1987, pp. 268–269.

A hardware implemented moving average processor is disclosed in Japanese Patent Laying-Open Nos. 63-187366 and 63-19071.

SUMMARY OF THE INVENTION

It is an object of the present invention to provide an improved moving average processor avoiding disadvantages in a conventional method of moving average processing.

It is another object of the present invention to provide a moving average processor capable of fast moving average processing in small scaled hardware implementation.

It is a further object of the present invention to provide a moving average processor easily adaptive to changes in conditions of the moving average processing.

A moving average processor according to the present invention comprises a delay circuit for outputting data preceding by N sampling periods to input sample data, an adder having one input receive the input sample data, a second delay circuit for outputting data preceding by one sampling period to an output of the adder, a subtractor for evaluating a difference between an output of the first delay circuit and that of the second delay circuit, and a divider for dividing an output of the subtractor by coefficient (N−1) to output the result of the division. The adder has the other input supplied with the output of the subtractor.

In the above described configuration, the first delay circuit outputs data preceding by N sampling periods to input data. The adder, the second delay circuit and the subtractor constitute an accumulator. The second delay circuit stores the sum of input data preceding by one sampling period through N sampling periods to the present input data. Therefore, the subtractor provides the sum of the input data preceding by one sampling period through (N−1) periods to the present input data. Therefore, it becomes possible to carry out the moving average processing of (N−1) terms by division by the coefficient (N−1) in the divider.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
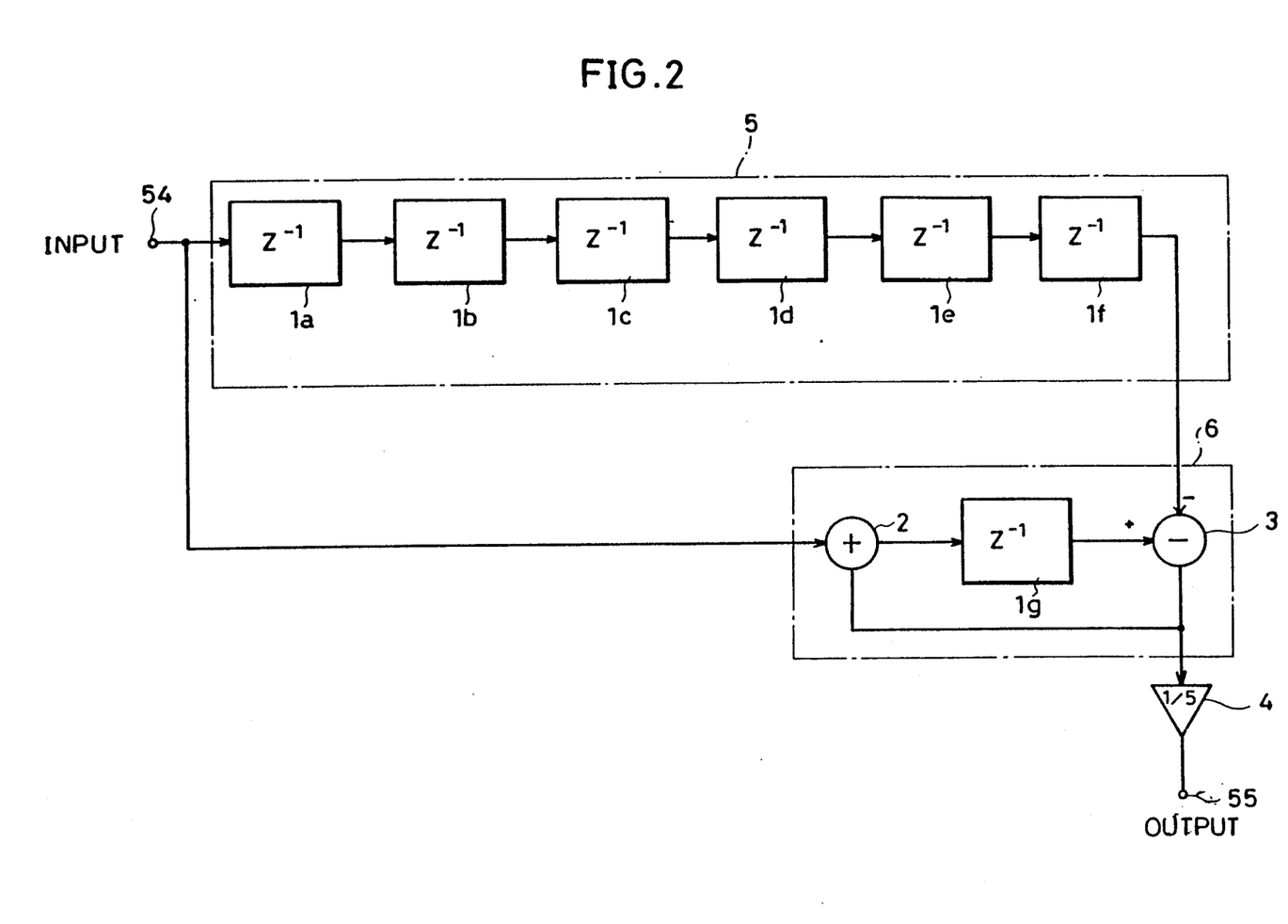
FIG. 2 is a diagram illustrating the configuration of a moving average processor according to one embodiment of the present invention.

FIG. 2 shows the configuration of a moving average processor according to one embodiment of the present invention. Referring to FIG. 2, the moving average processor comprises a delay circuit 5 for outputting data preceding by six sampling periods to input data applied via an input terminal 54, an accumulator 6 for storing the sum of a series of six sequential input data and also outputting the sum of five sequential data preceding by one sampling period through five sampling periods to input data, and a multiplier 4 for multiplying an output of the accumulator 6 by a predetermined coefficient (1/5) to output a result of the multiplication. Moving average data is outputted from the multiplier 4 via an output terminal 55.

The delay circuit 5 comprises six stages of cascade-connected delay elements 1a, 1b, 1c, 1d, 1e and 1f. Each time the input data is supplied via the input terminal 54, the respective delay elements 1a to 1f transfer the supplied data to their associated delay elements at the succeeding stages and also latch the supplied data. Therefore, a delay time in each of the delay elements 1a to 1f in the delay circuit 5 is not equivalent to the sampling period itself of the input data, but corresponds to a period for the input data to be supplied to the input terminal 54.

The accumulating circuit 6 comprises an adder 2 having one input receive the input data supplied via the input terminal 54, a delay element 1g for delaying an output of the adder 2 by a period corresponding to one sampling period to output the result of the delay, and a subtractor 3 for performing subtraction between an output of the delay element 1g and that of the delay circuit 5. An output of the subtractor 3 is applied to the other input of the adder 2. The timing of the delay elements 1a-1f and 1g to transfer the data are in synchronization with each other. An operation will now be described.

The input terminal 54 is supplied with digital data sampled in a predetermined sampling period. At this time, the sampling period of the input data may or may not coincide with an application period of the input data to be supplied to the input terminal 54. The input data is sequentially transmitted to the adding circuit 2 via the input terminal 54. The data transmitted to the adder 2 is sequentially accumulated in an accumulating circuit 6 formed of the adder 2, the delay element 1g and the subtractor 3. Assuming that the delay elements 1a–1g are first reset, data D (i) outputted from the accumulating circuit 6 after i cycles is expressed as follows for input data {Ai}.

$$D(1) = A1$$

$$D(2) = A1 + A2$$

$$D(3) = A1 + A2 + A3$$

$$D(4) = A1 + A2 + A3 + A4$$

$$D(5) = A1 + A2 + A3 + A4 + A5$$

$$D(i) = A_{i-4} + A_{i-3} + A_{i-2} + A_{i-1} + A_i$$

For example, an output of the delay element 1g after the six cycles is expressed as follows.

$$A1 + A2 + A3 + A4 + A5 + A6$$

At this time, data A1 preceding by six sampling periods to data A6 is outputted from the delay circuit 5. The subtractor 3 subtracts the output of the delay circuit from that of the delay element 1g. Thus, an output D' (6) of the subtractor 3 is expressed as follows.

$$D'(6) = A2 + A3 + A4 + A5 + A6$$

This data D' (6) is added to input data A7 by the adder 2 and transmitted to the delay element 1g to be latched therein. That is, the sum of five terms of input data is always accumulated in this accumulating circuit 6.

An output of the accumulating circuit 6 (namely, the output of the subtractor 3) is transmitted to the multiplier 4 to be multiplied by the coefficient (1/5), and then is outputted. Accordingly, moving average data is obtained from the output terminal 55. In the configuration shown in FIG. 2, the accumulator 6 is formed of only the adder 2, the delay element 1g and the subtractor 3 which are connected in cascade with one other to constitute a loop. Therefore, in the case of deriving output data from the accumulating circuit 6, the data is outputted at high speed only with the delay time in the subtractor 3.

Figure 3:
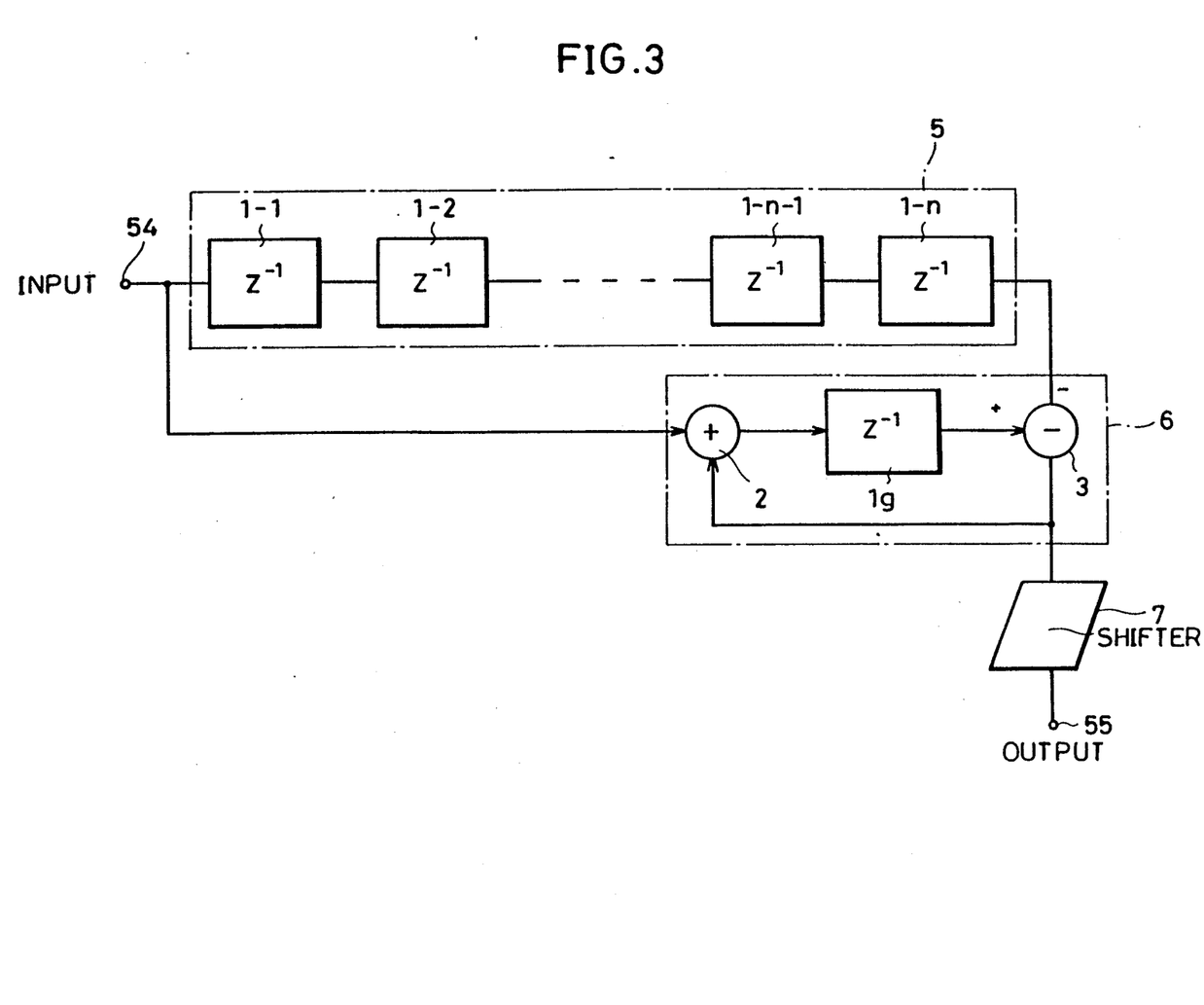
FIG. 3 is a diagram illustrating the configuration of a moving average processor according to another embodiment of the present invention.

In the case of normalization by employing the multiplier (a divider) shown in FIG. 2, this divider (multiplier) has a large-scaled configuration. It is also possible to simplify the configuration of this multiplier. FIG. 3 shows the configuration of the multiplier for normalization appropriate to a high degree of integration.

Referring to FIG. 3, a delay circuit 5 comprises n stages of cascade-connected delay elements 1-1, 1-2, 1-(n−1) and 1-n. The accumulating circuit 6 has the same configuration as that shown in FIG. 2. The number of terms of moving average is (N−1) in the configuration shown in FIG. 3. In this case, the output of the accumulating circuit 2 need be divided by the (N−1) in order to find a moving average value. A shifter 7 is provided as the divider for normalization in the configuration in FIG. 2.

Figure 4:
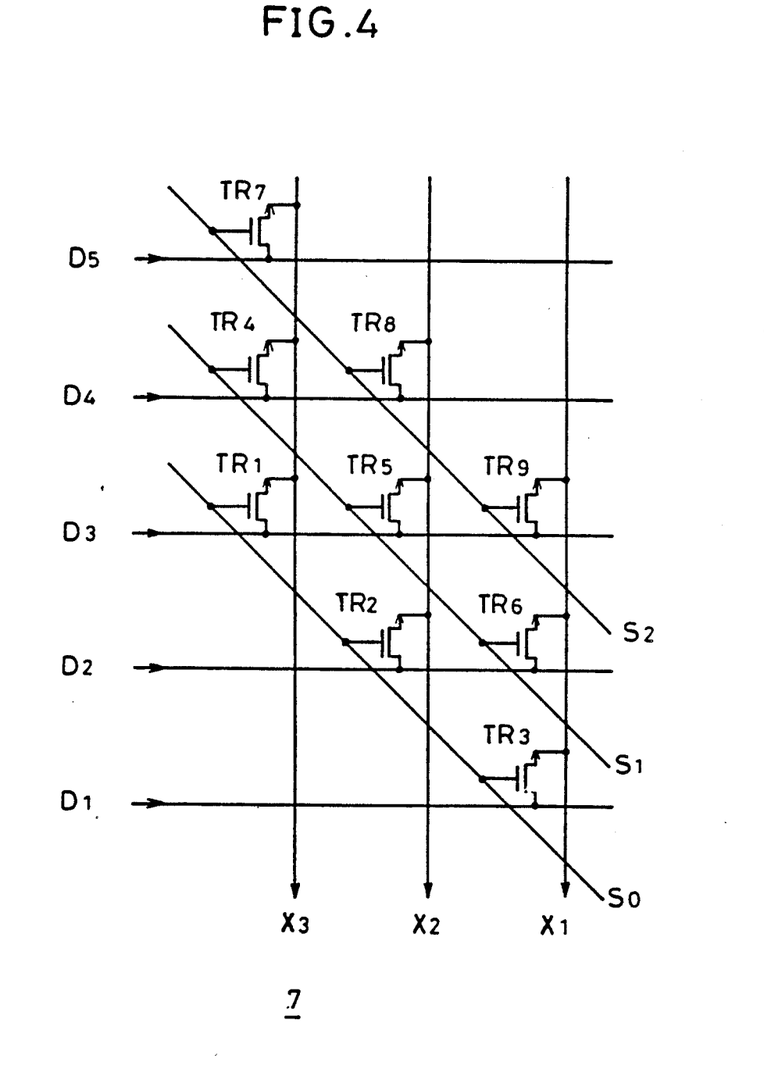
FIG. 4 is a diagram illustrating one example of the configuration of a shifter shown in FIG. 3.

The shifter 7 serves to shift a bit position of supplied data to output the shifted data. That is, data outputted from the accumulating circuit 6 has its amplitude, i.e., its magnitude normally represented in a plurality of bits. The shifter 7 effectively carries out division by shifting bit positions of data represented in the plurality of bits. FIG. 4 shows one example of the detailed configuration of the shifter 7.

FIG. 4 shows as an example the configuration of the shifter in which input data (i.e., the output of the accumulating circuit 6) is 5 bits of data D1 to D5, and an output thereof is 3 bits of X1 to X3. MOS transistors (insulated gate type transistors) TR1, TR4 and TR7 are provided at intersections of a data output line X3 and data input lines D3, D4 and D5, respectively. MOS transistors TR2, TR5 and TR8 are provided at intersections of a data output line X2 and data input lines D2, D3 and D4, respectively. MOS transistors TR3, TR6 and TR9 are provided at intersections of a data output line X1 and the data input lines D1, D2 and D3, respectively. For description of this configuration, the input and output data are denoted with the same reference designations as those of input and output signal lines, respectively. A control signal S0 is transmitted to the respective gates of the MOS transistors TR1, TR2 and TR3. A control signal S1 is transmitted to the respective gates of the MOS transistors TR4, TR5 and TR6. A control signal S2 is transmitted to the respective gates of the MOS transistors TR7, TR8 and TR9. The operation of the shifter shown in FIG. 4 will now be described.

It is now assumed that the input data bit D1 is the least significant bit, the bit D5 is the most significant bit, the output data bit X1 is the least significant bit, and the bit X3 is the most significant bit. When the control signal S0 is logical high or at the "H" level, the MOS transistors TR1, TR2 and TR3 are turned on. Therefore, in this case, the input data D1, D2 and D3 are respectively outputted as the output data X1, X2 and X3. No multiplying/dividing operation is carried out in this case.

A case will now be considered that the control signal S1 is at the "H" level. In this case, the transistors TR4, TR5 and TR6 are turned on. The input data D2, D3 and D4 are respectively outputted as the output data X1, X2 and X3. Therefore, the input data D2–D4 are respectively shifted by one bit position toward the least bit to be outputted. That is, the input data is multiplied by $\frac{1}{2}$ to be outputted.

Next, a case will be considered that the control signal S2 is at the "H" level. The transistors TR7, TR8 and TR9 are turned on at this time. The input data D3, D4 and D5 are respectively outputted as the output data X1, X2 and X3. Therefore, the input data D1–D5 are respectively multiplied by coefficients $\frac{1}{4}$ to be outputted.

In this configuration, when the input data are of 5 bits, output data may be represented in 5 bits for more accurate data outputting. This extension in representation can easily be carried out. That is, a matrix in FIG. 4 may be extended to a five-row five-column configuration.

In the configuration of the shifter shown in FIG. 4, the number of terms of the moving average is powers of two, and normalization coefficients thereof are 1, $\frac{1}{2}$, $\frac{1}{4}$, . . . . As apparently seen in FIG. 4, only M transistors for input data of M bits are required for the shift circuit 7 (namely, this required number of the transistors is the number of those selected by a single control signal line, and output data is also of M bits). As a matter of course, in the case that the shifter has the coefficients selectable, the required number of the transistors increases in accordance with these coefficients.

When employing the shifter shown in FIG. 4, the required number of delay elements included in the delay circuit 5 is greater by one than the number of moving average terms, so that the delay elements of odd number stages are required.

When employing the shifter shown in FIG. 3, even if the number of moving average terms is increased, the required number of MOS transistors employed therefor is equal to a bit length of the input data. Therefore, the occupied area of this shifter can be significantly reduced compared to the configuration of the conventional multiplying circuit, resulting in a significant simplification of the circuit configuration thereof. In the above configuration, the amount of delay in the delay circuit 5 is fixed, so that the number of moving average terms cannot be changed in accordance with a processing content. Then, a configuration with the variable number of moving average terms is shown in FIG. 5.

Figure 5:
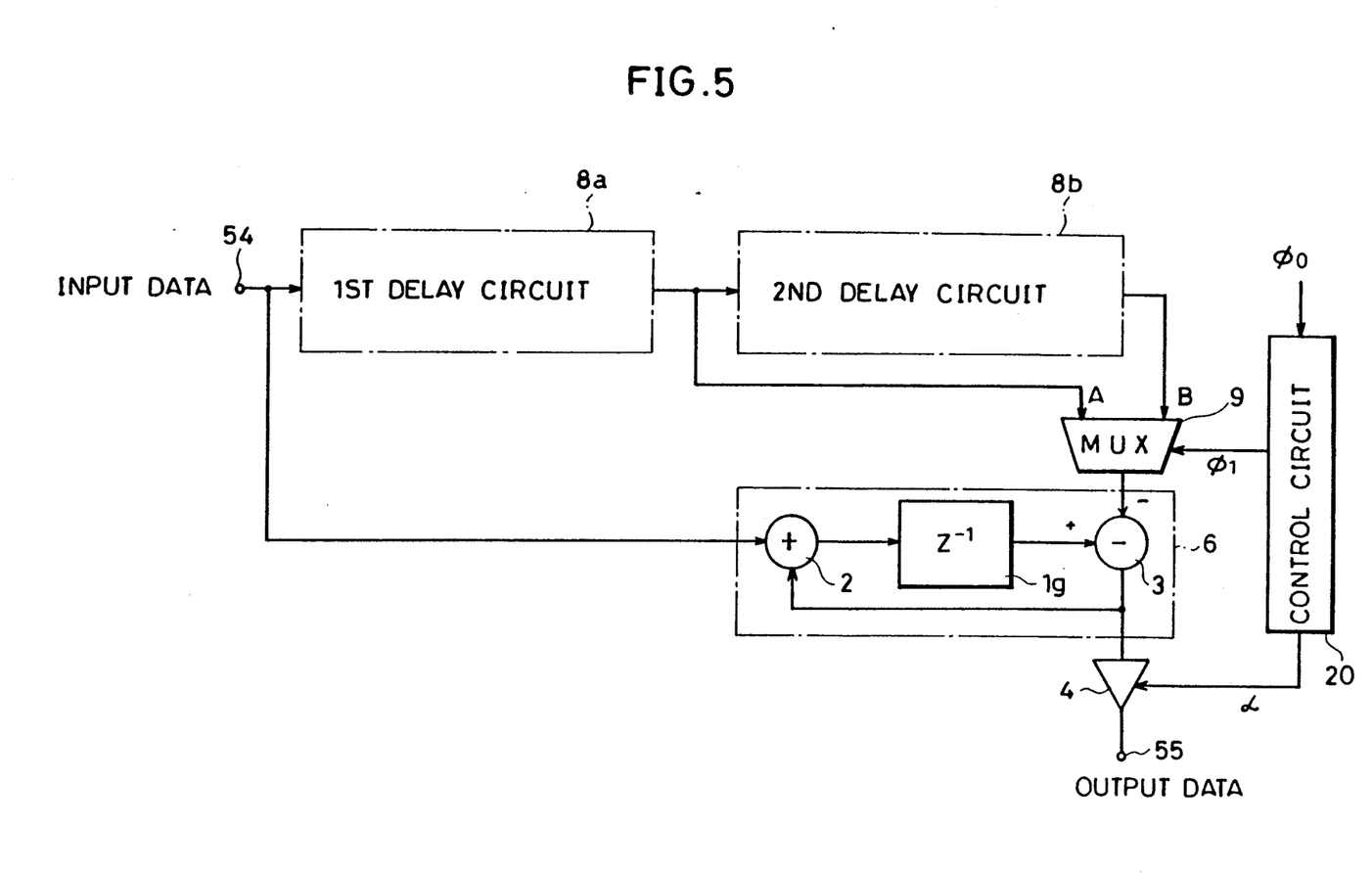
FIG. 5 is a diagram illustrating the configuration of a moving average processor according to still another embodiment of the present invention.

Referring to FIG. 5, in order to make the number of moving average terms variable, a first delay circuit 8a and a second delay circuit 8b are provided to delay the input data transmitted from the input terminal 54 by a predetermined time period. The first delay circuit 8a and the second delay circuit 8b are connected in cascade. A selector 9 is provided to selectively pass therethrough one of output data sent from the first and second delay circuits 8a and 8b and transmit the same to the accumulator 6. The selector 9 has one input terminal A receive an output of the first delay circuit 8a and the other input terminal B receive an output of the second delay circuit 8b.

A control circuit 20 is provided to control a selecting operation of the selector 9. The control circuit 20 transmits a selecting signal $\phi 1$ to the selector 9 in response to a moving average term number instructing signal $\phi 0$ which is externally applied. The selector 9 selectively passes therethrough one of the data to be applied to the input terminals A and B in response to a control signal $\phi 1$. At this time, the control circuit 20 outputs a multiplication (division) coefficient $a$ in accordance with the selecting signal $\phi 1$. The coefficient $a$) is, for example, stored in a ROM (Read Only Memory) and is read out from this ROM responsive to this selection instructing signal $\phi 0$ to be applied to the multiplier 4.

The multiplier 4 multiplies the coefficient $a$ from the control circuit 20 by an output from the accumulator 6 so as to output a moving average value. Therefore, according to the configuration shown in FIG. 5, it is possible to make variable the amount of delay of the input data and accordingly a coefficient in the multiplier. Thus, it is possible to make the number of moving average terms variable, resulting in a moving average processor of high flexibility.

Figure 6:
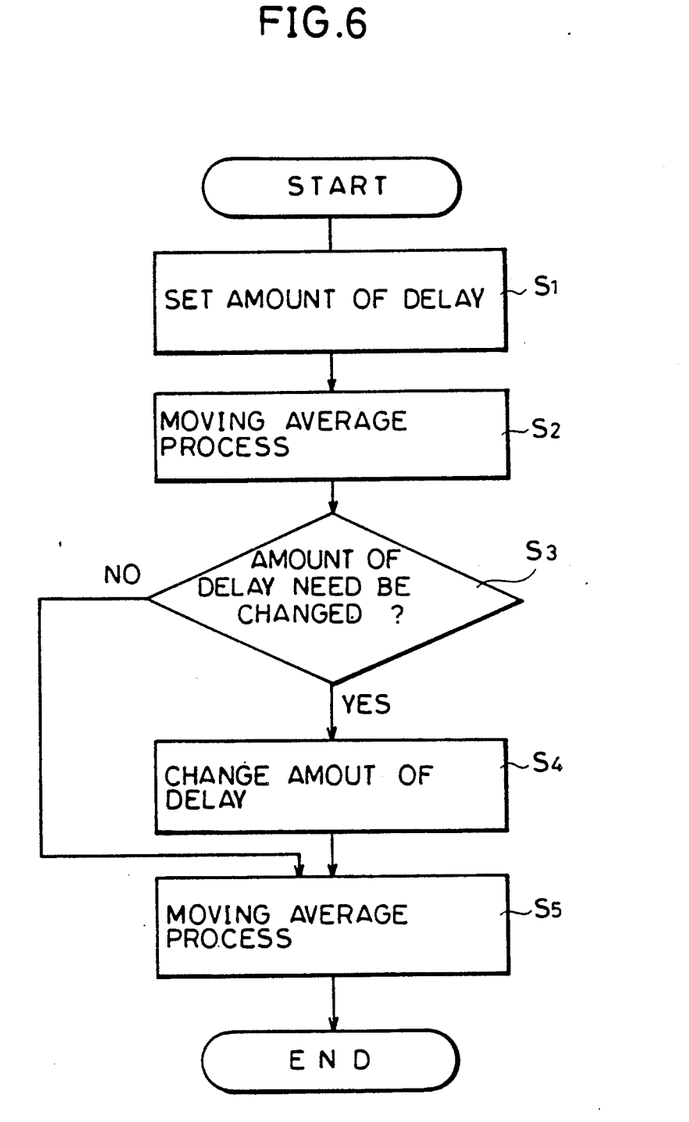
FIG. 6 is a flow chart illustrating the operation of a control circuit in performing by software control selecting operations of a selector and on a multiplication coefficient shown in FIG. 5.

In the above described configuration of the control circuit 20, the number of average terms is varied in response to the instructing signal $\phi 0$ externally applied. Alternatively, a control over the selecting operation of the selector 9 can also be carried out by software. That is, such configuration is also possible as to monitor the moving average value outputted from the multiplier 4 and to control the selecting operation of the selector 9 in accordance with a result of the monitor. FIG. 6 shows an operation flow of the control circuit 20 in this case. A control operation of the control circuit 20 will now be described with reference to FIG. 6.

First of all, a selecting signal is applied to the selector 9 so as to set the amount of delay for input data (step S1). The moving average processing is carried out in accordance with the set amount of delay (step S2). Moving average value information outputted in accordance with this moving average processing is monitored, and then a decision is made on whether or not the amount of delay need be changed based on a result of this monitor (step S3). As a reference for this decision, for example, the presence/absence of a high frequency component (a noise component) included in a series of moving average values outputted may be employed. When a number of high frequency components are included therein, it is decided that there are less moving average terms and much noise, and thus the number of moving average terms is increased. When no or very few high frequency components are included in the series, this set amount of delay is kept unchanged. When it is decided that the amount of delay need be changed in the step S3, a selecting signal is applied to the selector 9 so as to change the amount of delay. This change in the amount of delay (the number of moving average terms) is carried out by changing a selective input in the selector 9 and the coefficient $a$ for the multiplier (step S4). The moving average processing is successively carried out in accordance with this changed amount of delay (step S5). When it is decided that no change in the amount of delay is required in the step S3, the moving average processing is successively carried out in the step S5, with the step S4 skipped.

This change in the amount of delay and in the multiplication coefficient by a software control enables a flexible change of the processing conditions depending on the properties of the input data, also enabling adaptive processing.

As for this configuration, in the case of employing the shifter shown in FIG. 4 as the multiplier, a division coefficient can be changed merely by changing the selecting signal Si, and further the number of moving average terms can easily be changed in a simple circuit configuration.

In the configuration shown in FIG. 5, the first and second delay circuits 8a and 8b are provided to vary the amount of delay for the input data, and one of outputs thereof is selected by the selector 9. However, this configuration is mere one example, and thus, needless to say, it can be extended to a configuration that a larger number of stages of delay circuits are connected in cascade, and thus any one of outputs thereof is selected by the selector 9.

Figure 7:
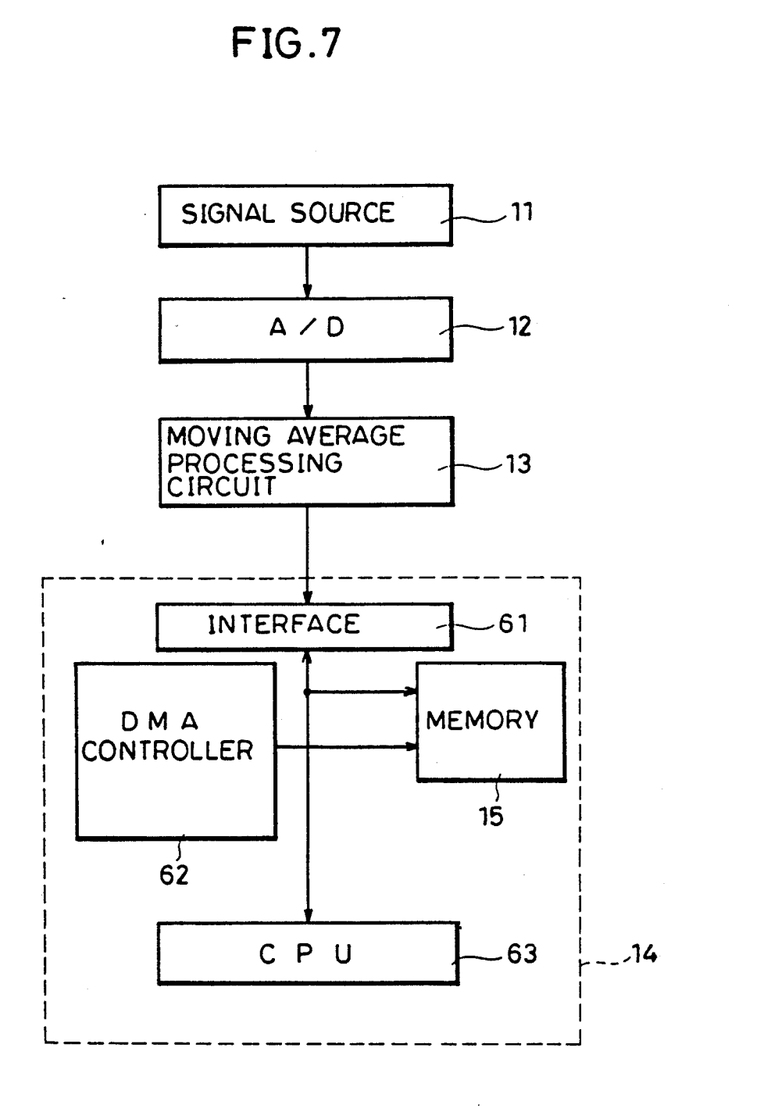
FIG. 7 is a diagram illustrating one example of a configuration in organizing a data processing system by employing a moving average processor according to the present invention.

FIG. 7 shows an example of a configuration that a data processing system is organized by employing the above described moving average processor.

Referring to FIG. 7, the data processing system includes a processor 14 for carrying out desired processing on a moving average value from a moving average processing circuit 13. The processor 14 includes an interface 61 for receiving/sending external data, a memory 15 for storing desired data, a DMA (Direct Memory Access) controller 62 for controlling a direct transfer of data between the moving average processing circuit 13 and the memory 15, and a central processing unit (CPU) 63 for carrying out various processing operations.

The moving average processing circuit 13 has configuration as shown in FIGS. 2, 3 and 5. In order to supply a series of sampling data to the moving average processing circuit 13, an analog/digital (A/D) converter 12 is provided for converting an analog signal transmitted from a signal source 11 into a digital signal to output a desired series of sample value data. An operation will now briefly be described.

The analog signal derived from the signal source 11 is made discrete in the A/D converter 12 and supplied as the series of sample value data to the moving average processing circuit 13. The supplied series of sample value data is subject to the moving average processing carried out by the moving average processing circuit 13 and then sent to the processor 14. The processor 14 writes moving average value data sent from the moving average processing circuit 13 into the memory 15 via the interface 61 under control of the DMA controller 62. Due to this data transfer carried out by a DMA (Direct Memory Access) transfer, a result of the moving average processing of the data sent from the signal source 11 can be sent to the memory device 15 within the processor 14 in parallel to an arithmetic operation of the CPU 63 within the processor 14. The moving average value sent from the moving average processing circuit 13 is subject to desired data processing by the CPU 63 within the processor 14.

Figure 8:
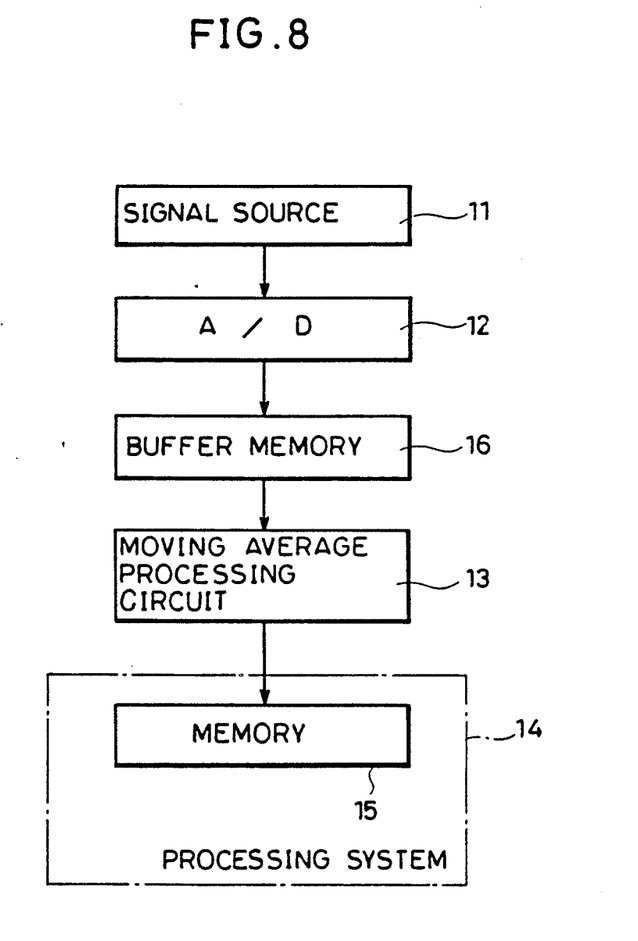
FIG. 8 is a diagram illustrating an example of another configuration in organizing the data processing system by employing a moving average processor according to the present invention.

In the configuration shown in FIG. 7, a case is considered that a processing speed of the moving average processing circuit 13 does not cope with the A/D converting operation of the A/D converter 12, i.e., the sampling period of the converter. That is, a case is considered that the sampling period of the A/D converter 12 is faster than the processing speed of the moving average processing circuit 13 and/or that of the processor 14. In this case, a buffer memory 16 is provided between the A/D converter 12 and the moving average processing circuit 13, as shown in FIG. 8. Accordingly, outputs from the A/D converter 12 can sequentially be sent adaptive to the processing speed of the moving average processing circuit 13 and/or that of the processor 14.

For example, a FIFO (First-in, First-out) memory, a register, a normal dynamic random access memory or the like can be employed for the buffer memory 16. In the case that an input signal derived from the signal source 11 has a large valid frequency band, a higher sampling frequency of the A/D converter 12, namely, the shorter sampling period is required. In the case, in particular, that a cycle time of the processor 14 (a time required for a predetermined processing of a certain data) is long, as shown in FIG. 8, the efficient data processing can be performed by sequentially storing a series of sample value data in the intervening memory device (buffer memory) 16 operable at high speed and then sending data from the buffer memory 16 to the moving average processing circuit 13 in accordance with an operation speed of the processor 14.

In the configuration shown in FIG. 8, the buffer memory 16 is provided between the A/D converter 12 and the moving average processing circuit 13. However, in the case that the moving average processing circuit 13 is able to carry out the moving average processing at higher speed than the operation speed of the processor 14, the buffer memory 16 may be provided between the moving average processing circuit 13 and the processor 14. In the case that the output of the moving average processing circuit 13 is, for example, sent via a communication line to the processor 14 provided at a center and processed therein, a data transmitting speed of the communication line is normally low, so that provision of the buffer memory between the moving average processing circuit 13 and an interface for the communication line enables more effective data transmitting and processing.

As has been described, in the present invention, since the moving average processing circuit is formed of the first delay circuit for outputting input data preceding by M sampling periods to the input sample data, the accumulator for storing the sum of the output of the first delay circuit and the input data through the input data of (M−1) terms, and the divider for dividing this accumulator output by (M−1) to output the moving average value, it is possible to carry out the faster and more efficient moving average processing in a small-scaled hardware implementation.

In addition, since the accumulator is in particular formed of the adder having one input receive the input data, another delay circuit for delaying the adder output by one sampling period, and the subtractor for taking a difference between the output of the first delay circuit and that of another delay circuit to supply the same to the divider for normalization and also to the other input of the adder, the moving average processing can be carried out at higher speed with a simple configuration.

Moreover, the configuration that the output of only one of the cascade-connected first delay circuits is selected to be supplied to the accumulator permits a flexible adaptation to the modification in the processing conditions or parameters. This configuration also permits the selection of the output of the delay circuit and the selection of the coefficient to be controlled by employing software, so that the flexible adaptation can also be realized to the modification in the processing conditions.

Furthermore, employment of the above described moving average processor employing the DMA transfer or the fast operable intervening memory device enables the moving average value data to be transmitted to the processing system in harmony with the operation speed of the processing system for carrying out predetermined processing for the moving average value data, so that a highly efficient data processing system can be organized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A device for finding a moving average of a series of data sampled at a predetermined sampling period, comprising:
   first delay means for sequentially receiving said series of data and for delaying each of the data by a time period corresponding to N sampling periods to output a result of the delay, N being an integer;
   adding means having one input receive sequentially each data of said series of data;
   second delay means for delaying an output of said adding means by a time period corresponding to one sampling period to output a result of the delay;
   subtracting means for carrying out subtraction between an output of said second delay means and that of said first delay means; and means for dividing an output of said subtracting means by a coefficient (N−1) to produce a moving average output of said device, said adding means having the other input receive the output of said subtracting means for adding the data supplied to said one input and said subtracting means output to output a result of the addition.

2. A device according to claim 1, wherein
each said sampled data is formed of a plurality of bits, and
said dividing means comprises means for shifting 3 of the plurality of bits of data from said subtracting means.

3. A device according to claim 2, wherein
said means for shifting comprises
a plurality of data input lines for transmitting therethrough supplied data bits,
a plurality of data output lines provided to intersect with said data input lines,
a plurality of coupling elements, provided at predetermined intersections of said data input lines and said data output lines, each for coupling a corresponding data input line and a corresponding data output line, and
a plurality of control signal lines provided in a direction of intersecting with said data input lines and said data output lines for selectively activating said plurality of coupling elements.

4. A device for finding a moving average of a series of data sampled at a predetermined sampling period, comprising:
first delay means for sequentially receiving said series of data and for delaying each of the data by a time period corresponding to N sampling periods to output a result of the delay, N being an integer, wherein said first delay means comprises a plurality of cascade-connected delay circuit means;
adding means having one input receive sequentially each data of said series of data;
second delay means for delaying an output of said adding means by a time period corresponding to one sampling period to output a result of the delay;
subtracting means for carrying out subtraction between an output of said second delay means and an output of said first delay means, said adding means having the other input receive the output of said subtracting means for adding the data supplied to said one input and said subtracting means output to output a result of the addition;
means for dividing an output of said subtracting means by a coefficient (N−1) to produce a moving average output of said device;
selecting means for selectively passing one output from said plurality of cascade-connected delay circuit means to said subtracting means, and
control means responsive to a moving average term number instructing signal for generating a signal for defining a selecting operation of said selecting means and a division coefficient for said dividing means.

5. A device according to claim 4, wherein
said moving average term number instructing signal is externally applied.

6. A device according to claim 4, wherein
said control means comprises
means for monitoring the moving average output of said device, and
means responsive to an output of said monitor means for generating said moving average term number instructing signal.

7. A system for digitally processing an analog signal applied from a signal source, comprising:
means for sampling the analog signal from said signal source at a predetermined sampling period to convert the sampled signal into digital signal data;
moving average processing means for carrying out moving average processing on an output of said converting means to produce a moving average output; and
means for carrying out predetermined data processing of said moving average output,
said moving average processing means comprising
first delay means for receiving output data of said converting means in series and delaying the received data by a time period corresponding to N sampling periods to output the delayed data, N being an integer,
adding means having one input receive the output data of said converting means in series,
second delay means for delaying an output of said adding means by a time period corresponding to one sampling period to output a result of the delay,
means for carrying out subtraction between an output of said second delay means and that of said first delay means, and
means for dividing an output of said subtracting means by a coefficient (N−1) to produce said moving average output,
said adding means having the other input receive the output of said subtracting means, and adding the data supplied to said one input and said subtracting means output to output a result of the addition.

8. A system of claim 7, further comprising
buffer means provided between said converting means and said moving average processing means for adjusting an operation speed of said converting means and that of said moving average processing means to each other.

9. A system of claim 7, further comprising
buffer means provided between said moving storage processing means and said data processing means for adjusting a processing speed of said moving average processing means and that of said data processing means to each other.

10. A method of finding a moving average of a series of data sampled at a predetermined sampling period, comprising the steps of:
delaying each of the data in said series of data by a time period corresponding to N sampling periods, N being an integer;
performing adding operation on the data delayed by the time period corresponding to said N sampling periods;
delaying the data added in said adding step by a time period corresponding to one sampling period;
performing subtracting operation between the data delayed by the time period corresponding to said N sampling periods and the data delayed by the time period corresponding to said one sampling period; and
dividing data obtained in said subtracting step by a coefficient (N−1),
said adding step comprising the step of adding the data obtained in said subtracting step and the data delayed by the time period corresponding to said N sampling periods.

11. A method of claim 11, wherein
each data of said series of data is represented in a plurality of bits, and
said dividing step comprises the step of shifting each bit of supplied data in a direction of the least significant bit.

* * * * *